US007924292B2

(12) United States Patent
Bujold et al.

(10) Patent No.: US 7,924,292 B2

(45) Date of Patent: Apr. 12, 2011

(54) DEVICE AND METHOD FOR REDUCING VISUAL ARTIFACTS IN COLOR IMAGES

(75) Inventors: Eric Bujold, Markham (CA); Robert Grant, Toronto (CA)

(73) Assignee: Broadcom Corportion, Irvine, CA (US)

( * ) Notice: Subject to any disclaimer, the term of this patent is extended or adjusted under 35 U.S.C. 154(b) by 668 days.

(21) Appl. No.: 11/848,366

(22) Filed: Aug. 31, 2007

(65) Prior Publication Data

US 2009/0060380 A1 Mar. 5, 2009

(51) Int. Cl.

| | |
|---|---|
| ***G06K 9/40*** | (2006.01) |
| ***G09G 5/00*** | (2006.01) |
| ***G09G 5/02*** | (2006.01) |
| ***H04N 5/44*** | (2006.01) |
| ***H04N 5/21*** | (2006.01) |
| ***G03F 3/08*** | (2006.01) |
| ***G06K 9/00*** | (2006.01) |

(52) U.S. Cl. ........ 345/603; 345/427; 345/589; 345/591; 345/600; 348/557; 348/630; 358/518; 358/519; 382/162; 382/167; 382/254; 382/274

(58) Field of Classification Search .......... 345/426–427, 345/428, 581, 589–591, 600–604, 545–549; 348/557–558, 560, 630, 571, 674; 358/515–518, 358/519, 523; 382/162, 167, 254, 276, 274

See application file for complete search history.

(56) References Cited

U.S. PATENT DOCUMENTS

| | | | | |
|---|---|---|---|---|
| 2004/0119859 | A1* | 6/2004 | Nishio et al. | 348/252 |
| 2006/0262224 | A1* | 11/2006 | Ha et al. | 348/582 |
| 2007/0183656 | A1* | 8/2007 | Kuwahara et al. | 382/162 |
| 2008/0193860 | A1* | 8/2008 | Hains | 430/5 |
| 2010/0067030 | A1* | 3/2010 | Imai et al. | 358/1.9 |

OTHER PUBLICATIONS

Jack, Keith, "Video Demystified: A Handbook for the Digital Engineer", 2005, pp. 15-34, Elsevier Inc.: Burlington, U.S.A.

* cited by examiner

*Primary Examiner* — Wesner Sajous

(74) *Attorney, Agent, or Firm* — McAndrews, Held & Malloy, Ltd.

(57) ABSTRACT

A circuit and method for reducing artifacts in decoded color video and images are disclosed. The circuit includes a buffer for receiving an input pixel in a first color-space, and a detector for determining after transformation into a second color-space, if at least one component of the transformed pixel would fall outside a predetermined range. The determination may be made by comparing components of the input pixel, to corresponding ranges in the first color-space. Upon determining that at least one component of the transformed pixel would be outside a corresponding predetermined bound in the second color-space, the detector causes the circuit to output a pixel in the first color-space, with at least one predetermined component. The output of the circuit may subsequently be converted to the second color-space by an external color-space converter and displayed onto a color display. The method reduces visible artifacts caused by clipping during color-space conversion.

32 Claims, 6 Drawing Sheets

DEVICE AND METHOD FOR REDUCING VISUAL ARTIFACTS IN COLOR IMAGES

FIELD OF THE INVENTION

The present invention relates generally to digital image processing, and more particularly to reduction of visual artifacts in color images and video arising from transmission errors or storage media defects.

BACKGROUND OF THE INVENTION

Current digital technologies are widely used in the production, transmission, storage and playback of images and video. Digital processing of images and video offers numerous advantages over analog video, including improved quality, efficient transmission using compression, a variety of storage media, and the convenient organization of content. As a result, images and video are now largely distributed digitally using mediums such as digital versatile discs (DVDs). In addition to DVDs, higher resolution formats such as high definition DVD (HD-DVD) and Blu-ray have become increasingly popular formats for movie distribution over the last few years.

In networked environments such as the Internet or local area networks, digital content can be easily downloaded to a client device (for example, a client computer's hard disk) from content servers. The trend toward digital distribution of multimedia content has thus been helped by the explosive growth of the Internet as a medium of communication over the last number of years. The ability to generate and store digital content inexpensively has in turn helped expand the reach of the Internet.

Video and image data are often compressed prior to being written onto storage media such as hard disks, flash memory, and DVD to reduce storage requirements; or prior to transmission to save transmission bandwidth. At a receiver, encoded video or image data is decoded and sent to a display device. Typical decoders include DVD players, HD-DVD players, Blu-ray players, portable digital video players, personal computers equipped with video player software and the like.

Part of the reason for the increasingly widespread adoption of digital transmission and storage of video is the ability to use error control codes such as forward error correction (FEC) codes, cyclic redundancy checks (CRC) and the like, to detect and sometimes correct corrupted data. Received data may be corrupted as a result of transmission errors or due to storage media defects.

Error control coding involves the controlled introduction of redundancy in the transmitted (or stored) data stream at a transmitter, in such a manner that allows a receiver to detect and sometimes correct erroneously received data. However, the use of error correcting codes adds to the bandwidth requirement of transmitted data (or equivalently to storage), which is undesirable. Using robust error correcting codes also increases the processing overhead and complexity of implementation of the transmitter and receiver. Therefore in most applications—including video streaming applications or digital video broadcasting—the error control codes used do not permit all transmission errors to be corrected. Consequently, some transmission errors do occur. Unfortunately, in image and video transmission, some of these errors may sometimes result in noticeable artifacts that are displeasing to the eye. Obviously, noise on the transmission channel increases the likelihood of bit errors in the received video stream.

When errors are detected in received images and video, the receiver typically attempts to correct the errors, or at least reduce their undesirable effects. However, this often may not always lead to a subjectively acceptable outcome. For example, in color image or video transmission, color images are typically transmitted and received as pixels with color components (Y, Cb, Cr) in the YCbCr color-space representing the luma Y and chroma Cb, Cr. At the receiver, these components are converted to their equivalents in the RGB color-space which is typically used by digital displays.

For a receiver that uses 8-bit per color component in RGB space, each color component (R, G, B) ranges from 0 to 255. In the presence of transmission errors however, received YCbCr components may map to RGB components that are invalid—(i.e., with one or more color components are outside the permissible bounds). In this case, erroneous values are often truncated to the nearest acceptable value for the color component. Unfortunately however, this often leads to very noticeable artifacts. Very bright colors that standout in an otherwise demure image are very visible and distracting to a viewer and therefore undesirable.

Accordingly, an improved method of processing received digital color images is needed to reduce artifacts that result from transmission errors.

SUMMARY OF THE INVENTION

In accordance with one aspect of the present invention there is provided, a circuit including a buffer for receiving an input pixel in a first color-space, and a detector. The buffer is in communication with the detector. The detector determines if a pixel formed by transforming the input pixel into a second color-space includes at least one component outside a corresponding predetermined bound in the second color-space. The circuit outputs an output pixel in the first color-space with at least one predetermined component upon determining that the transformed pixel would include at least one component outside its corresponding predetermined bound in the second color-space.

In accordance with another aspect of the present invention there is provided, a display adapter including a circuit and a color-space converter. The circuit includes a buffer for receiving an input pixel in a first color-space, and a detector. The buffer is in communication with the detector. The detector determines if a pixel formed by transforming the input pixel into a second color-space includes at least one component outside a corresponding predetermined bound in the second color-space. The circuit outputs an output pixel in the first color-space with at least one predetermined component upon determining that the transformed pixel would include at least one component outside its corresponding predetermined bound in the second color-space. The color-space converter is in communication with the circuit. The color-space converter receives the output pixel in the first color-space from the circuit, and outputs a corresponding pixel in the second color-space.

In accordance with yet another aspect of the present invention there is provided, a method of processing an input pixel including: receiving the input pixel in a first color-space; determining if at least one component of a pixel formed by transforming the input pixel into a second color-space falls outside a corresponding predetermined bound; and if so providing an output pixel in the first color-space with at least one predetermined component.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

DETAILED DESCRIPTION

Figure 1:
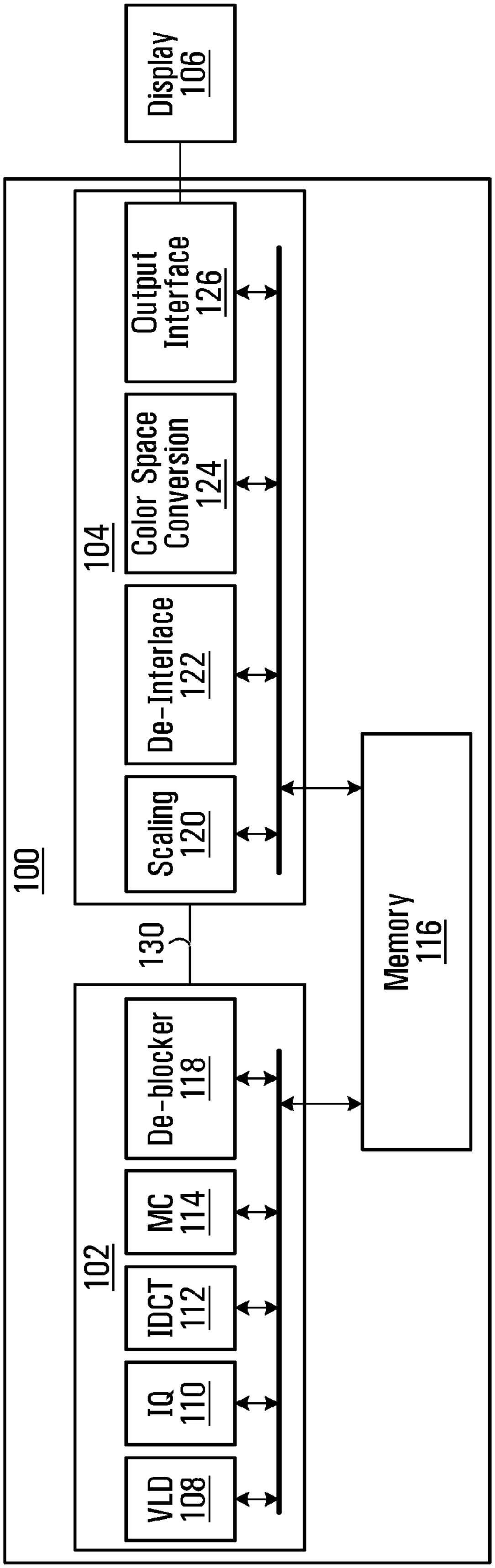
FIG. 1 is a simplified block diagram of a conventional video receiver.

FIG. 1 depicts a simplified block diagram of a conventional video receiver 100 capable of decoding and processing a compressed digital video stream. Receiver 100 includes a decoder 102 and a video processor 104.

Decoder 102 includes an entropy decoder or variable length decoder (VLD) 108, an inverse quantization block 110, an inverse transform block 112, a motion compensation block 114, and a de-blocker 118. Video processor 104 includes processing sub-blocks such as a scaling unit 120, a de-interlace block 122, color converter 124 and a video output interface 126. Video output interface 126 is interconnected with display 106.

Decoder 102 and video processor 104 are in communication with a block of memory 116 which may be used to provide a frame buffer. Output interface 126 may be a random access memory digital to analog converter (RAMDAC), digital visual interface (DVI) interface, a high definition multimedia interface (HDMI) interface or the like. Display 106, can be one of a television, computer monitor, liquid crystal display (LCD), a projector or the like.

Decoder 102 receives an encoded/compressed video stream, decodes it into pixel values and outputs decoded pixel data. The received input video stream may be compliant to an MPEG-2 format, H.264 (MPEG-4 Part 10) format, VC-1 (SMPTE 421M) format or the like. The input video stream may be received from a digital satellite receiver, or cable television set-top box, a local video archive, a flash memory, a DVD, an optical disc such as HD-DVD or Blu-ray disc, or the like.

Video processor 104 receives the decoded pixel data from decoder 102, processes the received data and provides a video image to an interconnected display 106.

Scaling unit 120, de-interlace block 122, and color converter 124 are functional blocks that may be implemented as dedicated integrated circuits, or as firmware code executing on a microcontroller or a similar combination of hardware and software.

Decoded video data may be transferred from decoder 102 to video processor 104 using data lines 130 or memory 116. An internal bus is used to transfer data from one sub-block to another with in decoder 102, and video processor 104 respectively.

The received video stream is entropy decoded by VLD 108. The output of VLD 108 is then inverse quantized using inverse quantization block 110 and an inverse transform (e.g., inverse discrete cosine transform) is carried out using inverse transform block 112. After appropriate motion compensation in MC block 114 and removal of blocking artifacts in de-blocker 118, decoded pixels are then output to video processor 104.

Video processor 104 may perform a variety of video post processing functions such as scaling, de-interlacing, and color-space conversion before outputting a final image to display 106.

As noted above, some data corruption may occur during transmission and these errors may sometimes result in noticeable artifacts. For example, invalid values may be output by decoder 102 as a result of corrupted input values. Invalid values may include pixel color components that are outside of valid ranges. At the encoder, input pixel color values of raw video are all within a predetermined bound or range, typically 0-255 for red, green and blue values. These RGB values are first transformed to YUV or YCbCr color-space and encoded using standard blocks for quantizing, transforming and entropy coding (variable length coding) to produce a compressed bit stream.

Figure 2:
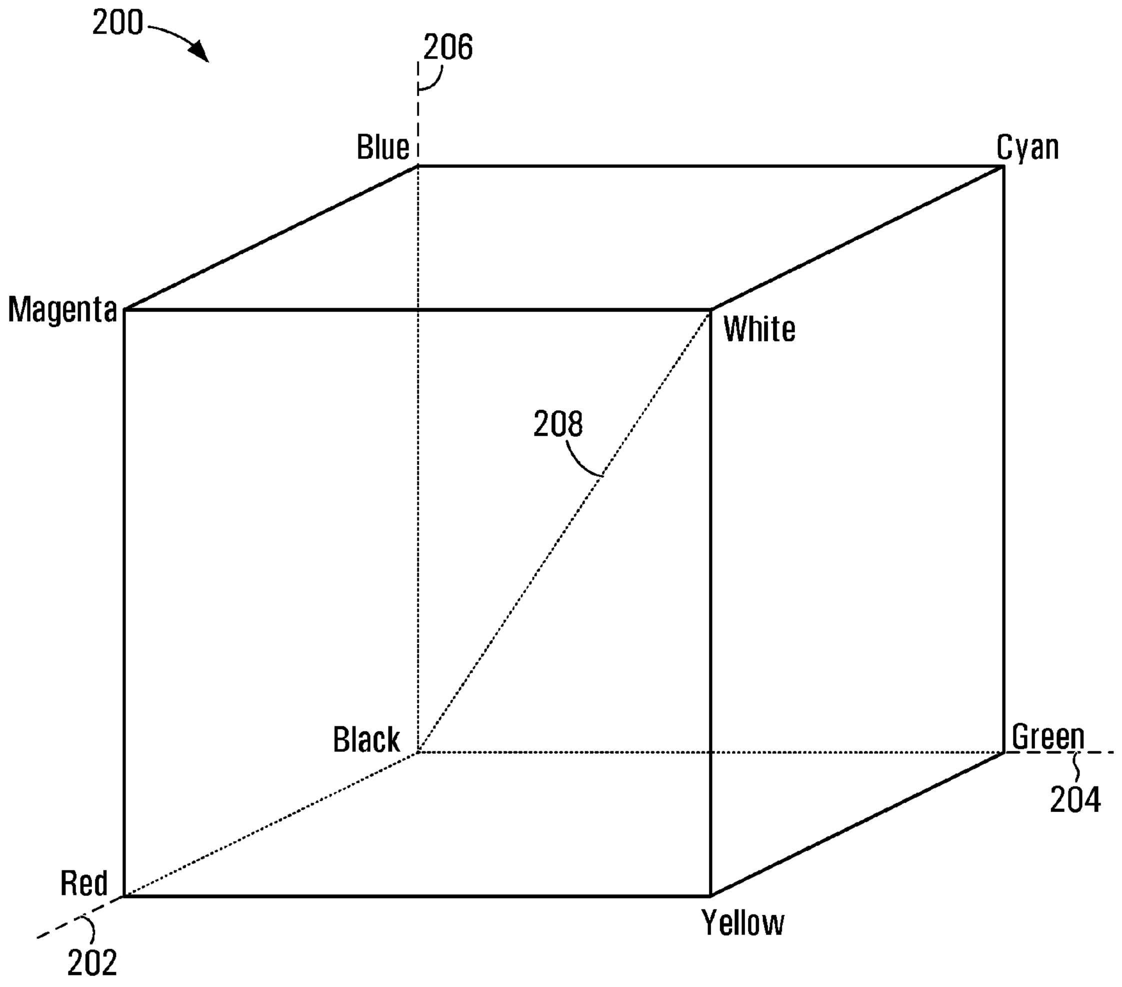
FIG. 2 is logical diagram of the RGB color cube.

FIG. 2 depicts a color cube 200 in the RGB color-space. The color components may be gamma corrected R'G'B' values. Each color is represented by its red component plotted along axis 202, its green component along axis 204 and its blue component shown along axis 206. Thus each color may be represented by a point (r', g', b') in the three dimensional color cube 200. For example the color black is located at (0,0,0); while the color white is at (255,255,255). All points along diagonal line 208 represent grey valued colors ranging from black to white.

The YCbCr color-space on the other hand, is a scaled and offset version of the YUV color-space. Y is defined to have a nominal 8-bit range of 16-235; Cb and Cr are defined to have a nominal range of 16-240. The YUV color-space is used by PAL (Phase Alternation Line), NTSC (National Television System Committee), and SECAM (Sequential Color with Memory) composite color video standards. Detailed discussions of the relationship between YCbCr, YUV and R'G'B' color-spaces can be found in Jack, Keith. 2005. *Video Demystified: A handbook for the digital engineer* 4th ed. Oxford: Elsevier, the contents of which are hereby incorporated by reference.

Conversions from YUV to gamma corrected R'G'B' values may be carried out using the following equations.

$$R'=Y+1.140V$$

$$G'=Y-0.395U-0.581V$$

$$B'=Y+2.032U$$

Similarly, conversions from YCbCr to gamma corrected R'G'B' values may be carried out using the following equations (with Y, Cb, Cr having nominal 8-bit ranges of 16-235, 16-235, 16-235 respectively).

$$R'=Y+1.371(Cr-128) \quad [1]$$

$$G'=Y-0.698(Cr-128)-0.336(Cb-128) \quad [2]$$

$$B'=Y+1.732(Cb-128) \quad [3]$$

Equations [1]-[3] are approximations and slightly different coefficients may be used for different applications depending on the display device, gamma correction, the video source, and the like. For example, the equations below may be used for some display terminals.

$$R'=1.164(Y-16)+1.596(Cr-128) \quad [5]$$

$$G'=1.164(Y-16)-0.813(Cr-128)-0.391(Cb-128) \quad [6]$$

$$B'=1.164(Y-16)+2.018(Cb-128) \quad [7]$$

Figure 3:
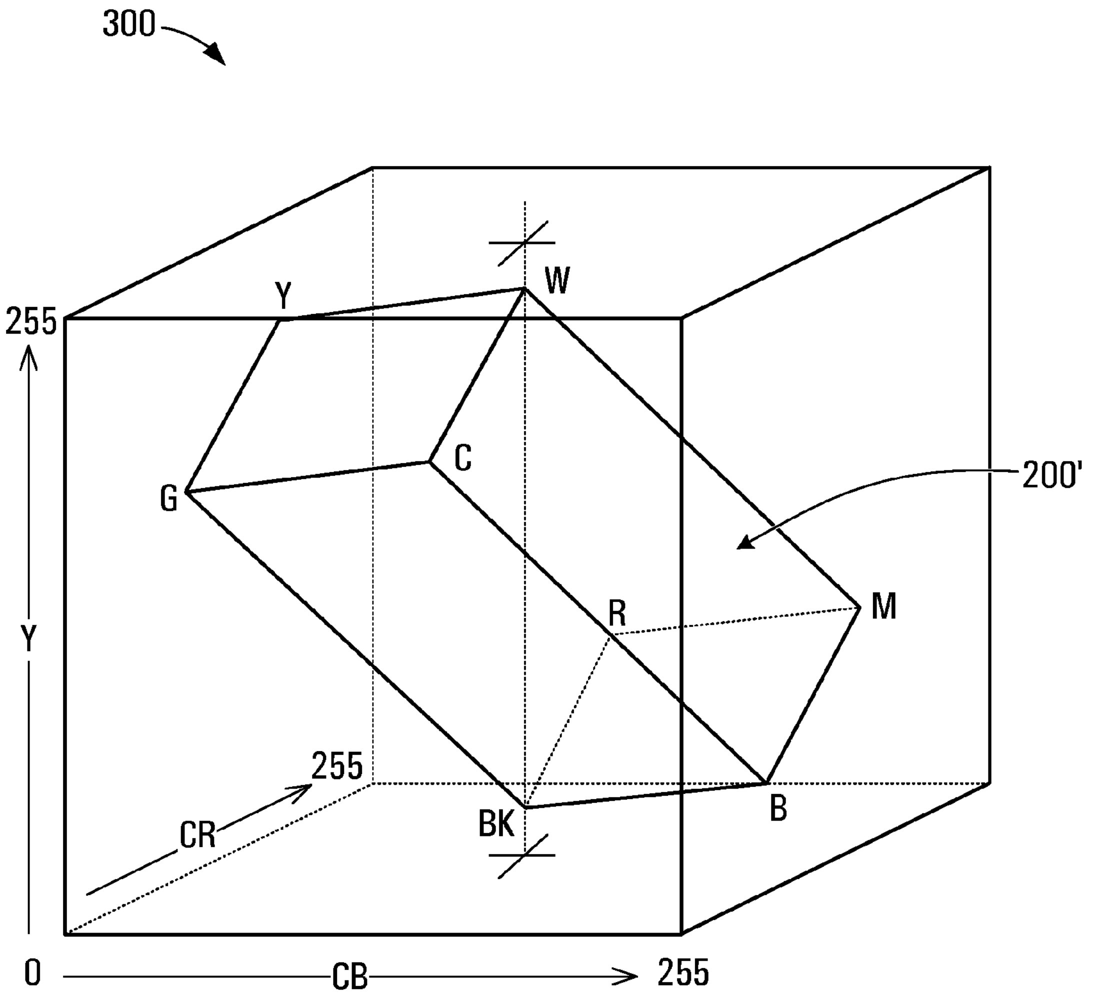
FIG. 3 is a logical diagram of a subset of values in the YCbCr color cube that remain valid in the RGB color cube of FIG. 2.

Not all possible YCbCr input values map to valid R'G'B' values within the defined range (0-255 for each of R', G' and B'). This may be easily seen when examining the RGB color cube 200' within the context of the YCbCr color-space as depicted in FIG. 3. As shown, there are many values in the YCbCr color-space 300 that lie outside the RGB cube 200'.

In the presence of transmission errors, or due to defects in physical media such as DVDs or optical discs, or other sources of error, invalid YCbCr color values may be output by decoder 102 of conventional receiver 100 (of FIG. 1). As noted, each YCbCr value is obtained from an R'G'B' color value. Each R'G'B' color includes defined ranges for R', G' and B'—for example, 0-255 when using 8 bits. Thus, if a YCbCr value is transformed to RGB color-space using equations [1]-[3], then the resulting R', G' and B' values should be with in the defined range (e.g., 0-255). If any of the resulting R', G' or B' values are invalid—that is, they fall outside the defined range—then the received YCbCr value is likely corrupted. In other words, if the received video bit stream is corrupted, then decoded YCbCr values may be outside of color cube 200'.

In conventional receivers such as receiver 100, color converter 124 which converts color components from a non-RGB color-space to an RGB color-space, uses a simple logic to limit or clip the R'G'B' output to be within the defined range. For example, in RGB displays that use 8-bits per color component, each color component may only range from 0 to 255. During color-space conversion, color converter 124 substitutes 0 when a negative value is calculated for a given color component, while for a computed color component that is greater than 255 is truncated to 255 by color converter 124. Unfortunately, this often leads to very noticeable bright pink or bright green artifacts. For example, when Cb and Cr are negative or zero, the computed R, B components are also negative (and hence typically truncated to 0) while the G component is positive, which leads to a green artifact. Similarly when Cb and Cr are above 255, a pink artifact may be observed after color-space conversion and truncation.

To prevent such artifacts, video receivers exemplary of embodiments of the present invention may include a different logic to translate non-RGB (e.g. YCbCr) colors that do not map to predetermined bounds or valid ranges in the RGB color-space.

Figure 4:
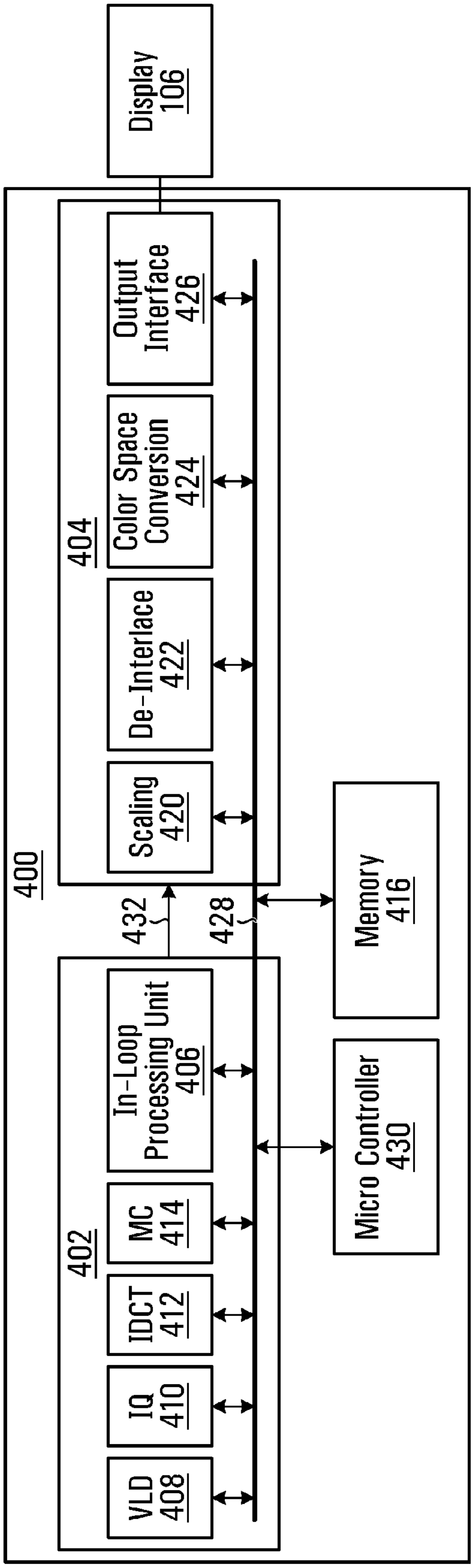
FIG. 4 is a schematic block diagram of a video receiver device exemplary of an embodiment of the present invention.

Accordingly, FIG. 4 depicts a schematic block diagram of a video receiver 400 exemplary of an embodiment of the present invention. Video receiver 400 accepts, decodes, and processes a compressed digital video stream, and outputs decoded images to an interconnected display 106.

Receiver 400 may include a decoder 402 and a video processor 404. Decoder 402 may further include a variable length decoder (VLD) 408, an inverse quantization (IQ) block 410, an inverse transform block 412, a motion compensation (MC) block 414 and an in-loop processing unit 406. A microcontroller 430 in communication with decoder 402 may form part of receiver 400. Video processor 404 may include a scaling unit 420, a de-interlace block 422, color converter 424 and a video output interface 426. Decoder 402 and video processor 404 may be in communication with memory 416 which may be used to provide a frame buffer.

Decoder 402 and video processor 404 may contain combinatorial and sequential circuitry, numerous local memory blocks, first-in-first-out (FIFO) memory structures, registers, and the like. Output interface 426 may provide output signals compliant to video graphics array (VGA), super VGA (SVGA), digital visual interface (DVI), high definition multimedia interface (HDMI) or other display interface standards. Display 106 may be a cathode ray tube (CRT) monitor, LCD, a projector, a television set, a flat panel display or the like.

Scaling unit 420, de-interlace block 422, and color converter 424 may be substantially similar to their counterparts in FIG. 1 and may be implemented in the form of dedicated circuits, firmware code executing on a microcontroller 428, or some other suitable combination of hardware and software.

A bus 428 may interconnect the various blocks and subblocks within receiver 400. Decoded video data may be transferred from decoder 402 to video processor 404 using bus 428, memory 416, or dedicated signal lines 432. Microcontroller 430 may program registers in sub-blocks such as inverse transform block 412, motion compensation block 414 and an in-loop processing unit 406 using bus 428.

Figure 5:
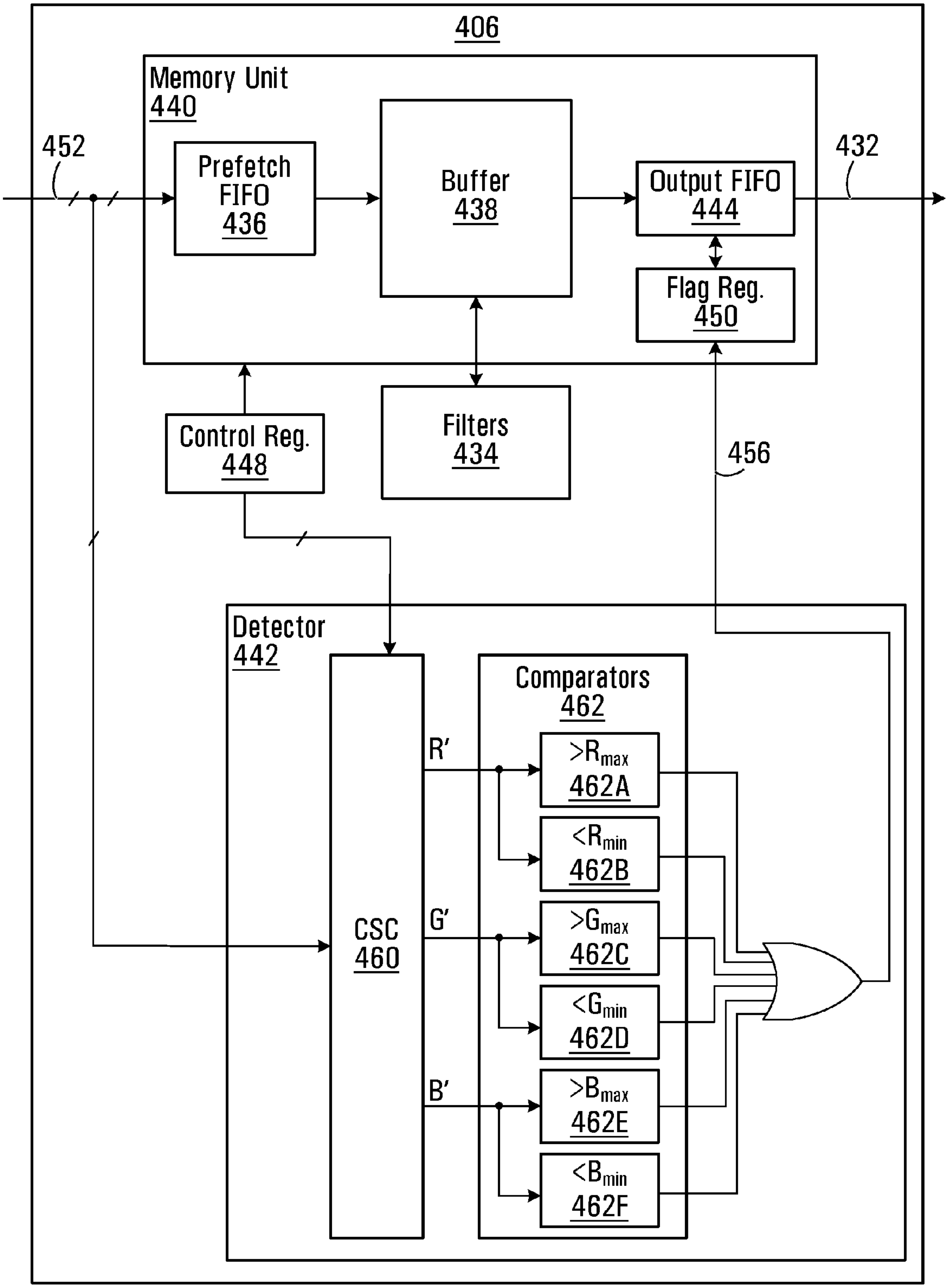
FIG. 5 is an enlarged schematic diagram of an in-loop processing unit in the video receiver device of FIG. 4.

FIG. 5 depicts an enlarged schematic diagram of in-loop processing unit 406 illustrating additional details. In-loop processing unit 406 may include filtering block 434, memory unit 440, an invalid color detector 442, and control register 448. Memory unit 440 may further include an incoming data input interface 436, data buffer 438 and output interface 444. Memory unit 440 may also include a flag register 450. Input interface 436 and output interface 444 may each include FIFO structures. Flag register 450 may have $2^m$ status bits or flags (e.g. $2^6$=64 flags) and may be in communication with a bus 456. Detector 442 may include a color-space conversion block 460 interconnected to a number of comparators 462A, 462B, 462C, 462D, 462E, 462F, (individually and collectively 462). Detector 442 may be capable of writing to at least some of the $2^m$ status bits in register 450 using bus 456. To address $2^m$ bits (e.g. 64 bits) in register 450, bus 456 may have m address line (i.e., 6 address lines), at least one data line and one or more control lines.

In operation, decoder 402 may also receive a compressed video stream compliant to a known standard such as MPEG-2, H.264 (MPEG-4 Part 10), VC-1 (SMPTE 421M). Again, the encoded input video stream may be received from a digital satellite receiver, or cable television set-top box, a local video archive, a flash memory, a DVD, an optical disc such as HD-DVD or Blu-ray disc, or the like.

The received video stream is entropy decoded by VLD 408. The output of VLD 108 is then inverse quantized using inverse quantization block 410 and an inverse transform may be carried out in inverse transform block 412. The inverse transform may be the inverse discrete cosine transform (IDCT). The output of inverse transform block 412 may be received by MC block 414 which may carry out required motion compensation processing. Output pixels from MC block 414 may be received by in-loop processing unit 406 directly; or alternately may be placed memory 416 from which they may be read into in-loop processing unit 406.

Video processor 404 may perform substantially the same functions as its counter part in FIG. 1 (video processor 104), including scaling, de-interlacing, color-space conversion and the like.

In-loop processing unit 406 contains filtering block 434 which may be used to remove blocking artifacts that are often observed when a block-oriented transform (such as DCT) is used by the encoding scheme to produce compressed video stream. An input bus 452 may be used to transfer data from MC block 414 to in-loop processing unit 406.

Detector 442 may tap input bus 452 and perform detection of pixel color values that are outside RGB cube 200' in FIG. 3 and therefore would not map to valid an R'G'B' value. For example, in an exemplary embodiment using 8-bits for each color component, detector 442 may signal output interface 444 by writing an error indicator bit to flag register 450 unless the conditions:

$$0 \leqq Y + 1.371(Cr - 128) \leqq 255 \text{ and}$$

$$0 \leqq Y - 0.698(Cr - 128) - 0.336(Cb - 128) \leqq 255 \text{ and}$$

$0 \leqq Y + 1.732(Cb - 128) \leqq 255$ are all satisfied by Y, Cb and Cr. As may be appreciated, the inequalities are derived directly from equations [1]-[3] above. Similar inequalities derived from equations [4]-[6] may also be used.

The inequalities can be tested by first using color-space conversion (CSC) block 460 within detector 442, to produce an intermediate pixel with R'G'B' components, and then using comparators 462 to determine if each component of the intermediate pixel is within predetermined bounds. CSC block 460 may be implemented using standard adders, multipliers and coefficient registers. Comparator 462A may be used to test that $R' \leqq R_{max}$ (e.g., $R_{max}=255$). Comparator 462B may be used to test that $0 \leqq R'$ (R' is computed by block 460 using equation [1]). Similarly, comparator 462C may be used to test that $G' \leqq G_{max}$ (e.g., $G_{max}=255$). Comparator 462D may be used to test that $0 \leqq G'$ (G' is computed by block 460 using equation [2]). Lastly, comparator 462F may be used to test that $0 \leqq B'$ (G' is computed by block 460 using equation [3]) while comparator 462E may be used to test that $B' \leqq B_{max}$ (e.g., $B_{max}=255$). Detector 442 may write an error indicator to flag register 450 using bus 456 for any pixel that fails to satisfy the above inequalities. Prior to outputting a pixel to video processor 404, output interface 444 may inspect flag register 450 and if an invalid color indicator bit is set then output interface 444 may replace the invalid pixel with a valid replacement pixel and output the valid pixel.

In another exemplary embodiment, the detector need not dynamically compute equations [1]-[3] for each (Y, Cb, Cr) component of a received pixel. Instead, predetermined ranges ($Y_{min}$, $Y_{max}$), ($Cb_{min}$, $Cb_{max}$), ($Cr_{min}$, $Cr_{max}$), corresponding to Y, Cb and Cr may be programmed into control register 448.

Figure 6:
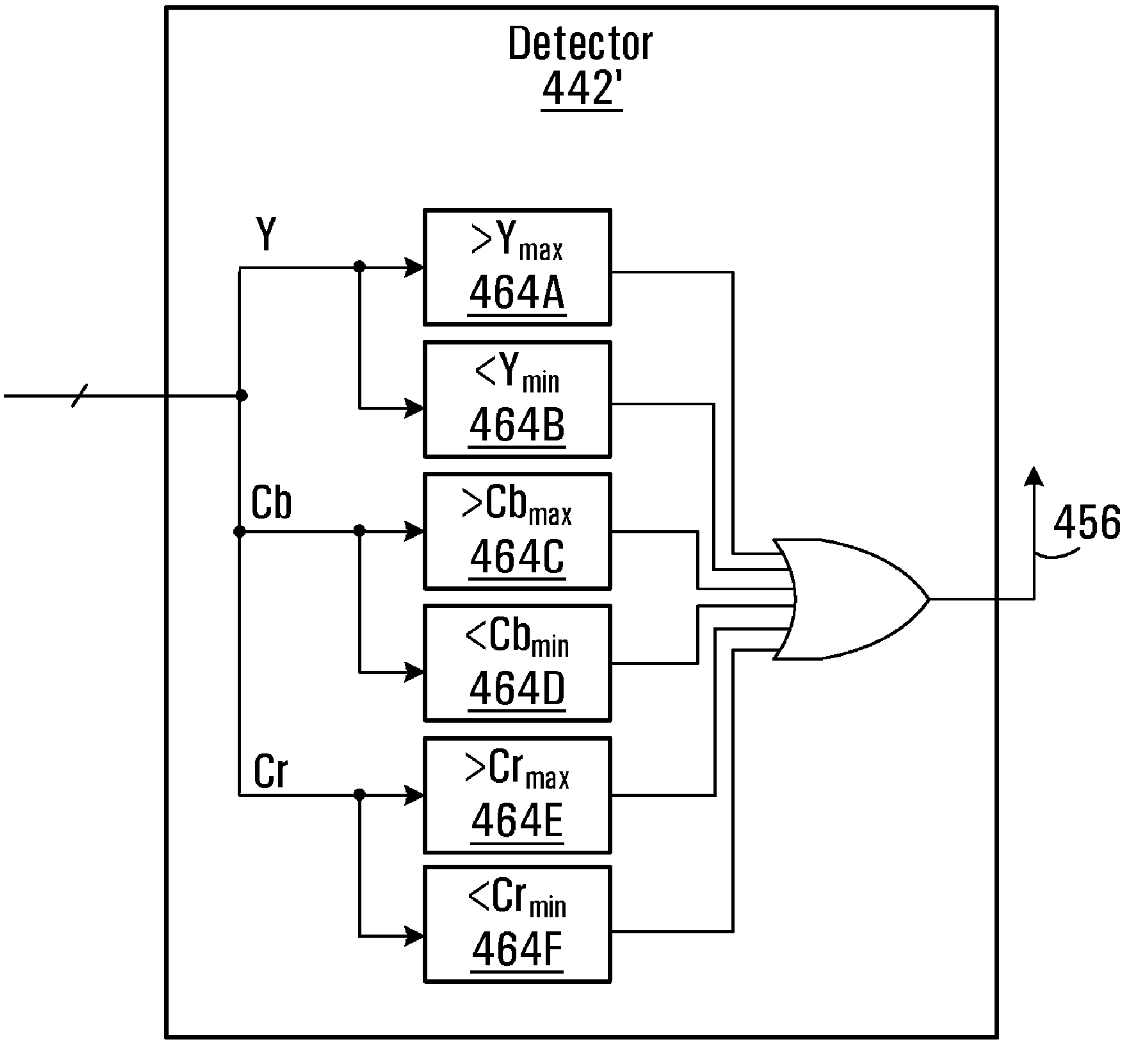
FIG. 6 is an enlarged schematic diagram of another embodiment of a detector in the in in-loop processing unit of FIG. 5.

Accordingly, FIG. 6 displays another embodiment of a detector 442' for determining if pixel in a first color-space (e.g. YCbCr), once color converted, would contain a component in a second color-space (e.g. RGB) that exceeds a predetermined bound, by performing a comparison of a pixel component in the first color-space (e.g. Y in YCbCr) to a corresponding range in the same first color-space (e.g., $Y_{min}$ to $Y_{max}$). In other words, detector 442' may compare a component of a pixel in a first color-space to a corresponding range also in the first color-space (e.g. check that $Y_{min} \leqq Y \leqq Y_{max}$) to determine if transforming the pixel to a second (e.g. RGB) color-space, would lead to a component (either R, G or B) being outside its corresponding predetermined bound (e.g. 0 to 255) in the second color space.

Detector 442' may include a number of comparators 464A, 464B, 464C, 464D, 464E, 464F, (individually and collectively 464). Detector 442' has the same input and output interfaces as detector 442, and thus may be capable of writing to at least some of the $2^m$ status bits in register 450 using bus 456.

Detector 442' signals output interface 444 to output a replacement pixel when a component is found to be outside its corresponding range in the YCbCr color-space. Exemplary values that may be commonly used to define these predetermined ranges include:

$$Y_{min}=16, Y_{max}=240, Cb_{min}=Cr_{min}=16, Cb_{max}=Cr_{max}=240;$$

or $$Y_{min}=8, Y_{max}=248, Cb_{min}=Cr_{min}=8, Cb_{max}=Cr_{max}=248.$$

Other values may of course be used to define the ranges. In addition, in specific embodiments, a single range may be used for both chroma values—that is, a single value $CbCr_{min}$ in register 448 may be used as both $Cb_{min}$ and $Cr_{min}$ and similarly the same value $CbCr_{max}$ in register 448 may be used as both $Cb_{max}$ and $Cr_{max}$.

An error condition to trigger a pixel component replacement may be flagged if, for example, $Y<Y_{min}$ or $Y>Y_{max}$. Similarly, an error may be flagged when one of the conditions $Cb<Cb_{min}$; $Cr<Cr_{min}$; $Cb>Cb_{max}$ or $Cr>Cr_{max}$ is satisfied. Unlike detector 442 (FIG. 5), detector 442' in FIG. 6 uses fixed limit values defined in the YCbCr space—i.e., predetermined ranges ($Y_{min}$, $Y_{max}$), ($Cb_{min}$, $Cb_{max}$), ($Cr_{min}$, $Cr_{max}$)—which are known to generate invalid color values in the RGB color space. Thus, explicit YCbCr to RGB conversion is not needed in detector 442'.

The replacement pixel may have color components that produce a grey pixel or a pixel color close to grey, so as not to produce highly visible artifacts.

In one exemplary embodiment, output interface 444 may replace an invalid pixel containing color components (Y, Cb, Cr), with a grey color pixel having color components (Y,128, 128) in the YCbCr color-space, if either one of Cb or Cr values is invalid. This replacement leaves the luma value Y unchanged while the chroma values Cr and Cb are set to 128 each. Conveniently, the replacement output pixel contains the same luma information (Y) as the original input pixel.

Equations [1]-[3] indicate that replacing any invalid color with a pixel having components (z, 128,128) for $0 \leqq z \leqq 255$ in the YCbCr color-space, produces a valid grey color of the form (z, z, z) in RGB space. Any color of the form (z, z, z) lies along line 208 (in FIG. 2) which represents all points of grey in RGB color cube 200. As noted above, grey is far less noticeable than a bright pink or bright green artifact that often results from truncating values to 0 or 255.

Noting that replacing an invalid color component with (Y,128,128) would produces a valid color only if $0 \leqq Y \leqq 255$, output interface 444 may replace invalid pixel with color components (Y, Cb, Cr) with (128,128,128) if the invalid components include Y (that is, if Y<0 or Y>255). If Y is an invalid component, output interface 444 may immediately replace Y by 128 or more generally by $2^{n-1}$ when n bits are used to represent Y.

Advantageously, detection of invalid values received via bus 452 by detector 442, ahead of outputting pixels to video processor 404 allows for convenient replacement of the output pixel's color components by output interface 444.

In another embodiment, output interface 444 may replace an invalid pixel containing color components (Y, Cb, Cr), with a fixed grey color pixel having color components (X,128, 128) in the YCbCr color-space. For 8-bit per color component display, by choosing X so that it is in the range $0 \leqq X \leqq 255$, a valid RGB color-space output pixel would be sent to display 106. Again using equations [1]-[3], it can be easily verified that (X,128,128) in the YCbCr color-space translates to (X, X, X) in the RGB color-space. In one specific exemplary embodiment, X may be fixed to 128 so that the replacement pixel is (128,128,128) in the YCbCr as well as RGB color-spaces.

In another embodiment, control register 448 may contain programmable fields for storing replacement color values $Y_{new}$, $Cr_{new}$ and $Cb_{new}$. Microcontroller 430 may program control register 448 with replacement color values $Y_{new}$, $Cr_{new}$ and $Cb_{new}$. When detector 442 indicates to output interface 444 that a current pixel has invalid color components (through bus 456 and flag register 450), then output interface 444 may replace the invalid pixel color values (Y, Cb, Cr) with ($Y_{new}$, $Cr_{new}$, $Cb_{new}$) respectively. Video processor 404 thus would receive the replacement pixel with components ($Y_{new}$, $Cr_{new}$, $Cb_{new}$) as its input. $Y_{new}$, $Cr_{new}$ and $Cb_{new}$ should be chosen so that they fall within color cube 200' in FIG. 2 (that is, they can be transformed to a valid color in the RGB color-space without further processing).

Advantageously programmable replacement color values allow the replacement colors to be adapted to the input video sequence as needed. Thus when out-of-range colors are detected, even less noticeable replacement colors (than grey colors) may be used instead of predetermined color values. For example, if a pixel is found to be corrupted, it may be replaced by a pixel derived from its neighboring pixels. In particular, the pixel to the left, above and above-left of a corrupted pixel, may be used to compute the replacement pixel. Neighboring pixels may be buffered in buffer 438 and used for computing a replacement pixel. Various methods for computing the replacement pixel from neighboring pixels such as averaging, substitution, filtering, interpolation and the like, are well known to those of ordinary skill in the art.

The replacement strategy—that is, whether to use neighboring pixels, replace a color component, use a completely predetermined pixel, etc. may be selectable by appropriately programming the video receiver hardware (via a control register 448, for example).

The above embodiments are discussed for cases in which color pixels ready for display output are represented by 8-bits per color component. However, the skilled reader would readily appreciate that for general representations with n-bits per color component, the range of valid (r', g', b') values may be determined by the conditions $\{R_{min} \leqq r' \leqq R_{max}\}$, $\{G_{min} \leqq g' \leqq G_{max}\}$ and $\{B_{min} \leqq b' \leqq B_{max}\}$ in which typically $R_{min}=G_{min}=B_{min}=0$ and $R_{max}=G_{max}=B_{max}=2^n-1$. Similarly the ranges ($Y_{min}$, $Y_{max}$), ($Cb_{min}$, $Cb_{max}$), ($Cr_{min}$, $Cr_{max}$) may be set to different values depending on n.

Thus for example, instead of using (Y, 128,128) for an invalid Cr or Cb component of an input pixel, for the general n-bit case, output interface 444 may use a replacement color of the form (Y, $2^{n-1}$, $2^{n-1}$) for $0 \leqq Y \leqq 2^n-1$ in YCbCr color-space, to produce a grey output pixel of the form (Y,Y,Y) in RGB color-space.

In an alternate embodiment, decoding and video processing operations may be combined in a single circuit which outputs R'G'B' colors. Here, color replacement may take place in the RGB color-space. In this case, computed r', g' and b' values may be temporarily stored in a buffer. If an interconnected display device represents each color component using n-bits, then a temporary buffer may be used to store each color component using m bits (m>n) per color component to allow examination of r', g' and b' without truncating them to n-bit values due to overflow. If at least one of r', g', or b' does not fall with in the range 0 to $2^n-1$, replacement color pixel of the form (z, z, z) in RGB color-space with $z \approx 2^{n-1}$ (and $0 \leqq z \leqq 2^n-1$) may be used to output a grey color (replacement pixel) directly in RGB color-space.

Replacing YCbCr pixels in in-loop processing unit 406 rather than replacing the transformed RGB pixels, may be advantageous as it allows a conventional video processor to be used. A video receiver, exemplary of an embodiment of the present invention, may thus contain a conventional video processor (such as video processor 108) interconnected with a video decoder such as decoder 402. Such a receiver would deliver the benefits of the present invention while still using a conventional video processor. This may be particularly advantageous in applications in which the decoder and the display processor (video processor) are independent from each other. Thus, in typical implementations the pixel replacement may be done within in-loop processing unit 406 while decoded YCbCr pixels are still in a pipeline, rather than at the display processing stage (e.g., in video processor 404) in which an extra processing filter would likely be required.

Circuits exemplary of embodiments of the present invention may be used in graphics display adapters. A graphics display adapter may include an exemplary circuit such as decoder 402, in communication with an external color-space converter unit (such as color converter 424). The color-space converter accepts its input from the exemplary circuit in YCbCr space and outputs a corresponding pixel for display in R'G'B' space to a display output interface. Since the exemplary circuit would ensure that its output (color converter's input) pixel components would map to valid R'G'B' values (i.e., within predetermined ranges for R', G' and B') artifacts associated with clipping would be avoided.

Advantageously, the external color converter unit may be a conventional color converter. That is, the exemplary circuit would provide to a conventional color converter, an input (in YCbCr color-space) that is guaranteed to have its R'G'B components (after color conversions) falling within their corresponding predetermined ranges (e.g., 0 to 255). Conveniently, this allows off the shelf color converter units (e.g., color converter 124) to be used, while delivering the benefits of the present invention.

Exemplary embodiments of the present invention may be used in conjunction with other error correcting methods implemented in VLD 408, IQ block 410, inverse transform block 412 and MC block 414. As noted, some of the corrupted pixels that are received, may not be detected and corrected in these blocks, and thus it is advantageous to include embodiments of the present invention in video receivers. In addition, some video coding standards may devote a higher proportion of the transmission bandwidth to actual video data and a correspondingly lower proportion to error correcting codes. This may lead to an increased number of received bit errors, which in turn makes the use of embodiments of the present invention in video receivers adapted to receive encoded video streams so encoded, desirable.

Of course, the above described embodiments are intended to be illustrative only and in no way limiting. The described embodiments of carrying out the invention are susceptible to many modifications of form, arrangement of parts, details and order of operation. The invention, rather, is intended to encompass all such modification within its scope, as defined by the claims.

What is claimed is:

1. A circuit comprising a buffer for receiving an input pixel in a first color-space, and a detector, said buffer in communication with said detector, said detector determining if a pixel formed by transforming said input pixel into a second color-space comprises at least one component outside a corresponding predetermined bound in said second color-space, said circuit outputting an output pixel in said first color-space with at least one predetermined component upon said determining.

2. The circuit of claim 1, wherein said detector comprises a comparator for determining if said at least one component in said second color-space would be outside said corresponding predetermined bound in said second color-space by comparing at least one component of said input pixel in said first color-space to a corresponding range in said first color-space.

3. The circuit of claim 1, wherein said detector comprises a color-space converter for transforming said input pixel from said first color-space into said second color-space.

4. The circuit of claim 2, wherein said first color-space is the YCbCr color-space, and said second color-space is the RGB color space.

5. The circuit of claim 4, wherein said RGB color-space is gamma corrected.

6. The circuit of claim 4, wherein said input pixel comprises components Y, Cb, Cr and said corresponding range for Y is defined by $Y_{min}$=16 and $Y_{max}$=240.

7. The circuit of claim 6, wherein said corresponding range for Cb and said corresponding range for Cr is a single range.

8. The circuit of claim 7, wherein said single range is defined by $CbCr_{min}$=16 and $CbCr_{max}$=240.

9. The circuit of claim 8, wherein $Y_{min}$=8, $Y_{max}$=248, $CbCr_{min}$=8 and $CbCr_{max}$=248.

10. The circuit of claim 6, further comprising a programmable register, wherein said register comprises fields for storing predetermined values $Cr_{new}$, and $Cb_{new}$, and said output pixel comprises color components (Y, $Cb_{new}$, $Cr_{new}$).

11. A video receiver comprising the circuit of claim 1.

12. The circuit of claim 1, wherein the color of said output pixel is grey.

13. A display adapter comprising:

(i) a circuit comprising a buffer for receiving an input pixel in a first color-space, and a detector, said buffer in communication with said detector, said detector determining if a pixel formed by transforming said input pixel into a second color-space comprises at least one component outside a corresponding predetermined bound in said second color-space, said circuit outputting an output pixel in said first color-space with at least one predetermined component upon said determining; and (ii) a color-space converter in communication with said circuit, for receiving said output pixel in said first color-space from said circuit, and outputting a pixel in said second color-space.

14. The display adapter of claim 13, wherein said first color-space is YCbCr.

15. The display adapter of claim 14, wherein said second color-space is RGB.

16. The display adapter of claim 15, wherein said RGB color-space is gamma corrected.

17. A method of processing an input pixel by a display adapter comprising:

receiving said input pixel in a first color-space;

determining if at least one component of a pixel formed by transforming said input pixel into a second color-space, falls outside a corresponding predetermined bound; and upon said determining, providing an output pixel in said first color-space with at least one predetermined component, wherein said receiving, determining, and providing is performed by one or more circuits of said display adapter.

18. The method of claim 17, wherein said first color-space is the YCbCr color-space, and said second color-space is the RGB color space.

19. The method of claim 18, wherein said RGB color-space is gamma corrected.

20. The method of claim 17, wherein said determining comprises comparing each component of said input pixel in said first color-space to a corresponding range within said first color-space.

21. The method of claim 17, wherein said determining comprises:

(i) transforming said input pixel into an intermediate pixel in said second color-space; and (ii) finding if at least one component of said intermediate pixel falls outside said corresponding predetermined bound.

22. The method of claim 20, wherein said first color-space is the YCbCr color-space, said input pixel comprises components Y, Cb and Cr, and said corresponding range for Y is defined by $Y_{min}$=16 and $Y_{max}$=240.

23. The method of claim 22, wherein said corresponding range for Cb and said corresponding range for Cr is a single range.

24. The method of claim 23, wherein said single range is defined by $CbCr_{min}$=16 and $CbCr_{max}$=240.

25. The method of claim 24, wherein $Y_{min}$=8, $Y_{max}$=248, $CbCr_{min}$=8 and $CbCr_{max}$=248.

26. The method of claim 17, wherein the color of said output pixel is grey.

27. The method of claim 17, wherein said output pixel is derived from neighboring pixels of said input pixel, in a digital image.

28. The method of claim 27, wherein said neighboring pixels comprise pixels to the left, above and above-left of said input pixel, in said image.

29. A method comprising:

receiving an input pixel in a first color-space by a buffer, wherein a circuit comprises said buffer and a detector;

determining if a pixel formed by transforming said input pixel into a second color-space comprises at least one component outside a corresponding predetermined bound in said second color-space, said determining performed by said detector, said circuit outputting an output pixel in said first color-space with at least one predetermined component upon said determining;

receiving said output pixel in said first color-space from said circuit by a color space converter in communication with said circuit; and outputting a pixel in said second color-space.

30. The method of claim 29, wherein said first color-space is YCbCr.

31. The method of claim 30, wherein said second color-space is RGB.

32. The method of claim 31, wherein said RGB color-space is gamma corrected.

* * * * *